(12) United States Patent
Secatch et al.

(10) Patent No.: US 11,901,013 B2
(45) Date of Patent: Feb. 13, 2024

(54) OPTIMIZATION OF REFERENCE VOLTAGES IN A NON-VOLATILE MEMORY (NVM)

(71) Applicant: Seagate Technology LLC, Fremont, CA (US)

(72) Inventors: Stacey Secatch, Niwot, CO (US); Jonathan Henze, Savage, MN (US)

(73) Assignee: Seagate Technology LLC, Fremont, CA (US)

( * ) Notice: Subject to any disclaimer, the term of this patent is extended or adjusted under 35 U.S.C. 154(b) by 125 days.

(21) Appl. No.: 17/541,973

(22) Filed: Dec. 3, 2021

(65) Prior Publication Data

US 2022/0180932 A1    Jun. 9, 2022

Related U.S. Application Data

(60) Provisional application No. 63/120,990, filed on Dec. 3, 2020.

(51) Int. Cl.
| | |
|---|---|
| *G11C 16/26* | (2006.01) |
| *G11C 16/10* | (2006.01) |
| *G11C 16/14* | (2006.01) |
| *G11C 16/30* | (2006.01) |
| *G11C 29/44* | (2006.01) |

(52) U.S. Cl.
CPC ............ *G11C 16/102* (2013.01); *G11C 16/14* (2013.01); *G11C 16/26* (2013.01); *G11C 16/30* (2013.01); *G11C 29/4401* (2013.01); *G11C 2207/2254* (2013.01)

(58) Field of Classification Search
None
See application file for complete search history.

(56) References Cited

U.S. PATENT DOCUMENTS

| | | |
|---|---|---|
| 8,582,374 B2 | 11/2013 | Mozak et al. |
| 9,711,239 B2 | 7/2017 | Venkatesan et al. |
| 9,824,728 B2 | 11/2017 | Chen et al. |
| 2019/0378589 A1* | 12/2019 | Perlmutter ............. G11C 29/52 |
| 2021/0311668 A1* | 10/2021 | Alhussien ........... G11C 11/5642 |

* cited by examiner

*Primary Examiner* — Alfredo Bermudez Lozada
(74) *Attorney, Agent, or Firm* — Hall Estill Law Firm

(57) ABSTRACT

Method and apparatus for managing data in a non-volatile memory (NVM) of a storage device, such as a solid-state drive (SSD). Data are stored to and retrieved from a group of memory cells in the NVM using a controller circuit. The data are retrieved using a first set of read voltages which are applied to the respective memory cells. The first set of read voltages are accumulated into a history distribution, which is evaluated to arrive at a second set of read voltages based upon characteristics of the history distribution. A calibration operation is performed on the memory cells using the second set of read voltages as a starting point. A final, third set of read voltages is obtained during the calibration operation to provide error rate performance at an acceptable level. The third set of read voltages are thereafter used for subsequent read operations.

20 Claims, 6 Drawing Sheets

OPTIMIZATION OF REFERENCE VOLTAGES IN A NON-VOLATILE MEMORY (NVM)

RELATED APPLICATIONS

This application makes a claim of domestic priority under 35 U.S.C. 119(e) to U.S. Provisional Patent Application No. 63/120,990 filed Dec. 3, 2020, the contents of which are hereby incorporated by reference.

SUMMARY

Various embodiments of the present disclosure are generally directed to a method and apparatus for optimizing reference voltages used to retrieve data from a non-volatile memory (NVM), such as but not limited to a three-dimensional (3D) NAND flash memory device.

In some embodiments, data are stored to and retrieved from a group of memory cells in the NVM using a controller circuit. The data are retrieved using a first set of read voltages which are applied to the respective memory cells. The first set of read voltages are accumulated into a history distribution, which is evaluated to arrive at a second set of read voltages based upon characteristics of the history distribution. A calibration operation is performed on the memory cells using the second set of read voltages as a starting point. A final, third set of read voltages is obtained during the calibration operation to provide error rate performance at an acceptable level. The third set of read voltages are thereafter used for subsequent read operations.

These and other features and advantages which characterize the various embodiments of the present disclosure can be understood in view of the following detailed discussion and the accompanying drawings.

DETAILED DESCRIPTION

Figure 1:
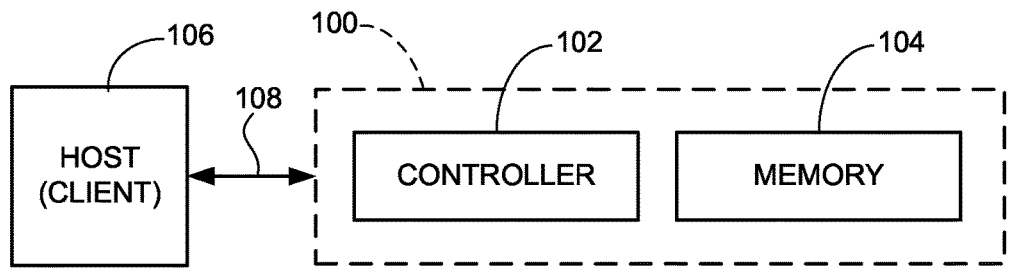
FIG. 1 provides a functional block representation of a data storage device constructed and operated in accordance with various embodiments of the present disclosure.

The present disclosure generally relates to systems and methods for managing data stored in a non-volatile memory (NVM), such as but not limited to a flash memory of a solid state drive (SSD).

Many current generation data storage devices such as SSDs utilize NAND flash memory to provide non-volatile storage of data from a host device. Flash memory generally operates to store data in the form of accumulated electrical charge on a floating gate of each memory cell in the flash array. The programmed state can be sensed through the application of one or more read sense voltages to the cell. The magnitude of the read voltage necessary to transition the cell from a non-conductive state to a conductive state generally indicates the programmed state of the cell.

These and other forms of erasable memories generally operate by being programmed to store data during a program (write) operation. Once programmed, the data may be read from the associated memory cells during subsequent read operations. The memory cells require an erasure operation to reset the memory cells before the cells can store replacement data. Each program/erase cycle is sometimes referred to as a PE cycle or PE count. A flash memory has a limited total number of PE counts that can be experienced during the operational life of the memory before the memory is worn out and no longer usable. Generally, the greater the number of bits stored by each cell, the lower the total number of PE counts that can be applied before the memory wears out.

In a flash memory cell, the read voltages are supplied to a gate structure, and the programmed state of the cell is indicated by the presence or absence of drain-source conductivity. Based on a number of factors, optimum read voltages can change over time. These factors can include, but are not limited to, existing temperature, temperature differentials between the time of programming and the time of reading, accumulated number of adjacent reads, aging of the data, aging of the memory cells, etc. Because of these and other factors, it has been found beneficial to perform read voltage ($V_{REF}$) calibration operations from time to time to identify optimum $V_{REF}$ values that can be applied to retrieve the stored data based on current environmental and operational conditions.

Various embodiments of the present disclosure are generally directed to a method and apparatus for managing a non-volatile memory (NVM), such as but not limited to a flash memory of a solid-state drive (SSD). In some embodiments, an adjusted read voltage is applied to a group of memory cells in an NVM to retrieve data therefrom. The adjusted read voltage is generated responsive to an analysis of previously presented read voltages. In this way, history data based on previously successful read voltages are used to optimize the selection of best fit read voltages for future read operations.

In some cases, the initial read voltages used during normal read operations and/or obtained during previous calibration operations can be characterized as a first set of read voltages. The initial read voltages selected by the manager circuit based on the statistical analysis of the first set of read voltages can be characterized as a second set of read voltages. The final, optimal set of voltages that provide the best performance as a result of the calibration operation (and are thereafter used during subsequent read operations) can be characterized as a third set of read voltages.

These and other features and advantages of various embodiments can be understood beginning with a review of FIG. 1 which provides a functional block diagram of an exemplary data storage device 100. The device 100 is characterized as a solid-state drive (SSD) that employs non-volatile semiconductor memory such as 3D NAND flash memory, although the present disclosure is not so limited.

The device 100 includes a controller circuit 102 and a memory module 104. The controller circuit 102 provides top-level control and communication functions as the device interacts with a host (client) device 106 over a suitable interface (I/F) 108 to store and retrieve host user data. The memory module 104 incorporates a non-volatile memory (NVM) to provide non-volatile storage of the data.

The controller 102 may be a programmable CPU processor that operates in conjunction with executable programming instructions (e.g., firmware) stored in a local computer memory within the device. The controller may alternatively be a hardware controller. The controller may be a separate circuit or the controller functionality may be incorporated directly into the memory module 104. The NVM may take any suitable form including, but not limited to, semiconductor memory (e.g., flash, STRAM, RRAM, MRAM, FeRAM, phase change memory, etc.), rotatable media (e.g., rotatable optical or magnetic recording discs, etc.), and so on.

As used herein, the term controller and the like will be broadly understood as an integrated circuit (IC) device or a group of interconnected IC devices that utilize a number of fundamental circuit elements such as but not limited to transistors, diodes, capacitors, resistors, inductors, waveguides, circuit paths, planes, printed circuit boards, memory elements, programmable processors, ASICs, programmable gate arrays, etc., to provide a functional circuit regardless whether the circuit is programmable or not. The controller may be arranged as a system on chip (SOC) IC device, a programmable processor, a state machine, a hardware circuit, a portion of a read channel in a memory module, etc.

Figure 2:
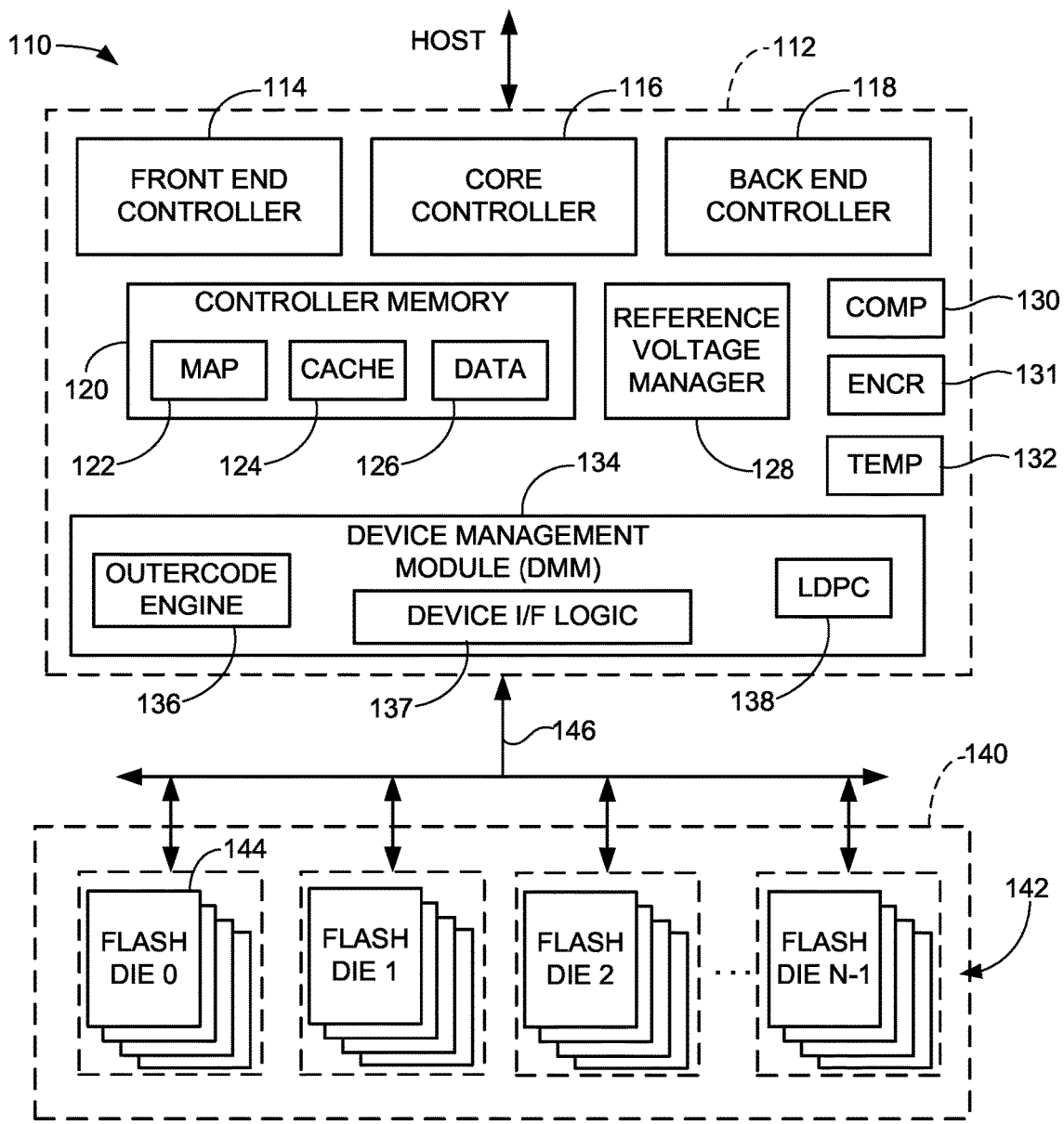
FIG. 2 illustrates the data storage device of FIG. 1 characterized as a solid state drive (SSD) that uses NAND flash memory in accordance with some embodiments.

In order to provide a detailed explanation of various embodiments, FIGS. 2 through 7 have been provided to describe relevant aspects of an exemplary data storage device 110 corresponding to the device 100 of FIG. 1. The device 110 is shown in FIG. 2 to be configured as a solid state drive (SSD) that communicates with one or more host devices via one or more Peripheral Component Interface Express (PCIe) ports. The NVM of the SSD 110 is contemplated as comprising 3D NAND flash memory, although other forms of solid state non-volatile memory can be used.

In at least some embodiments, the SSD operates in accordance with the NVMe (Non-Volatile Memory Express) Standard, which enables different users to allocate NVM sets (die sets) for use in the storage of data. Each die set may form a portion of an NVMe Namespace that may span multiple SSDs or be contained within a single SSD. Each NVMe Namespace will be owned and controlled by a different user (owner). While aspects of various embodiments are particularly applicable to devices operated in accordance with the NVMe Standard, such is not necessarily required.

The SSD 110 includes a controller circuit 112 with a front end controller 114, a core controller 116 and a back end controller 118. The front end controller 114 performs host I/F functions, the back end controller 118 directs data transfers with the memory module 111 and the core controller 116 provides top level control for the device.

Each controller 114, 116 and 118 includes a separate programmable processor with associated programming (e.g., firmware, FW) in a suitable memory location, as well as various hardware elements to execute data management and transfer functions. This is merely illustrative of one embodiment; in other embodiments, a single programmable processor (or less/more than three programmable processors) can be configured to carry out each of the front end, core and back end processes using associated FW in a suitable memory location. A pure or hybrid hardware based controller configuration can alternatively be used. The various controllers may be integrated into a single system on chip (SOC) integrated circuit device, or may be distributed among various discrete devices as required.

A controller memory 120 represents various forms of volatile and/or non-volatile memory (e.g., SRAM, DDR DRAM, flash, FeRAM, etc.) utilized as local memory by the controller 112. Various data structures and data sets may be stored by the memory including one or more map structures 122, one or more caches 124 for map data and other control information, and one or more data buffers 126 for the temporary storage of host (user) data during data transfers. A reference voltage manager circuit 128 operates as explained below to select optimum read voltages during read operations.

Additional functional blocks can be realized in or adjacent the controller 112, such as a data compression block 130, an encryption block 131 and a temperature sensor block 132. The data compression block 130 applies lossless data compression to input data sets during write operations, and subsequently provides data de-compression during read operations. The encryption block 131 applies cryptographic functions including encryption, hashes, decompression, etc. The temperature sensor 132 senses temperature of the SSD at one or more locations.

A device management module (DMM) 134 supports back end processing operations and may include an outer code engine circuit 136 to generate outer code, a device I/F logic circuit 137 and a low density parity check (LDPC) circuit 138 configured to generate LDPC codes as part of the error detection and correction strategy used to protect the data stored by the SSD 110.

A memory module 140 corresponds to the memory 104 in FIG. 1 and includes a non-volatile memory (NVM) in the form of a flash memory 142 distributed across a plural number N of flash memory dies 144. Flash memory control electronics (not separately shown in FIG. 2) may be provisioned on each die 144 to facilitate parallel data transfer operations via a number of channels (lanes) 146.

Figure 3:
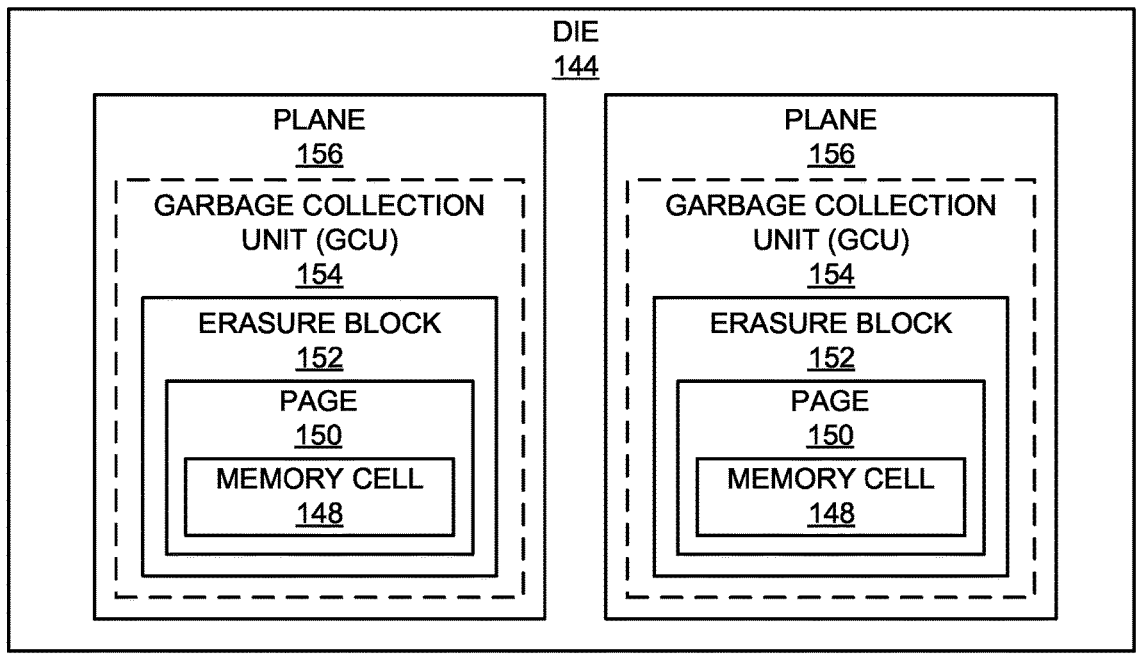
FIG. 3 is a physical and functional layout of the flash memory of FIG. 2 in some embodiments.

FIG. 3 shows a physical/logical arrangement of the various flash memory dies 144 in the flash memory 142 of FIG. 2 in some embodiments. Each die 144 incorporates a large number of flash memory cells 148. The cells may be arrayed in a three-dimensional (3D stacked) arrangement with various control lines (e.g., source, bit, word lines) to access the cells.

Groups of cells 148 are interconnected to a common word line to accommodate pages 150, which represent the smallest unit of data that can be accessed at a time. Depending on the storage scheme, multiple pages of data may be written to the same physical row of cells, such as in the case of MLCs (multi-level cells), TLCs (three-level cells), QLCs (four-level cells), and so on. Generally, n bits of data can be stored to a particular memory cell 148 using $2^n$ different charge states (e.g., TLCs use eight distinct charge levels to represent three bits of data, etc.). The storage size of a page can vary; some current generation flash memory pages are arranged to store 16 KB (16,384 bytes) of user data.

The memory cells 148 associated with a number of pages are integrated into an erasure block 152, which represents the smallest grouping of memory cells that can be concurrently erased in a NAND flash memory. A number of erasure blocks 152 are turn incorporated into a garbage collection unit (GCU) 154, which are logical storage units that utilize erasure blocks across different dies as explained below. GCUs are allocated and erased as a unit, and tend to span multiple dies.

During operation, a selected GCU is allocated for the storage of user data, and this continues until the GCU is filled. Once a sufficient amount of the stored data is determined to be stale (e.g., no longer the most current version), a garbage collection operation can be carried out to recycle the GCU. This includes identifying and relocating the current version data to a new location (e.g., a new GCU), followed by an erasure operation to reset the memory cells to an erased (unprogrammed) state. The recycled GCU is returned to an allocation pool for subsequent allocation to begin storing new user data. In one embodiment, each GCU 154 nominally uses a single erasure block 152 from each of a plurality of dies 144, such as 32 dies.

Each die 144 may further be organized as a plurality of planes 156. Examples include two planes per die as shown in FIG. 3, although other numbers of planes per die, such as four or eight planes per die can be used. Generally, a plane is a subdivision of the die 144 arranged with separate read/write/erase circuitry such that a given type of access operation (such as a write operation, etc.) can be carried out simultaneously by each of the planes to a common page address within the respective planes.

Figure 4:
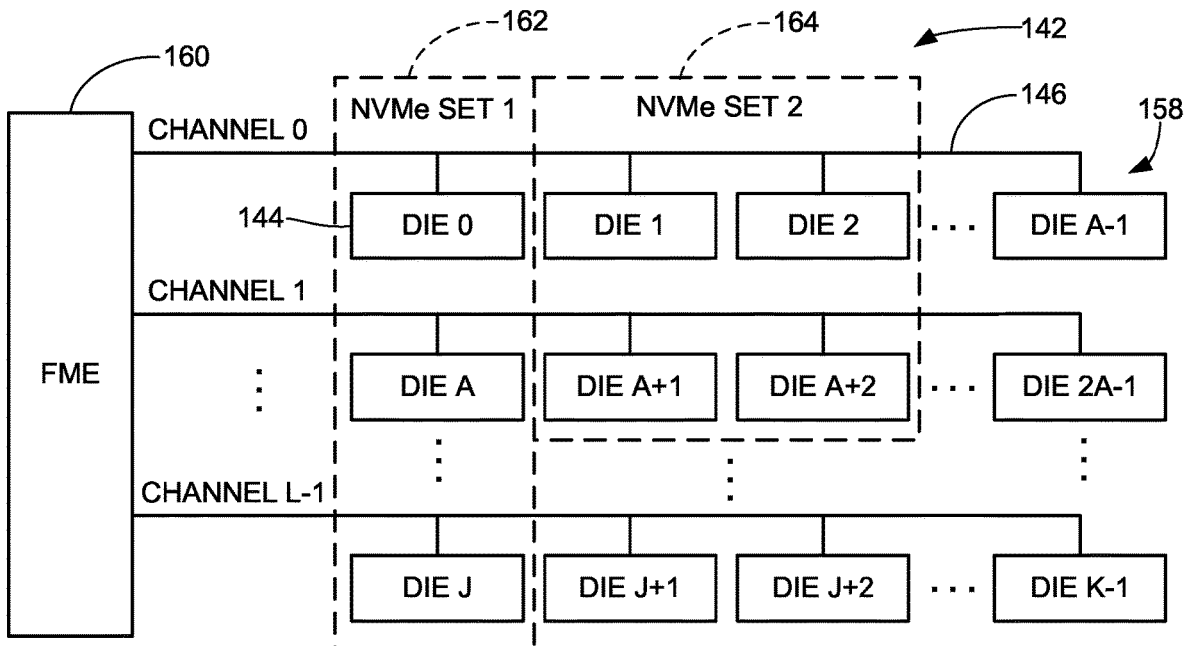
FIG. 4 shows the grouping of various dies of the flash memory of FIG. 2 in various die and NVM sets in some embodiments.

FIG. 4 shows further aspects of the flash memory 142 in some embodiments. A total number K dies 144 are provided and arranged into physical die groups 158. Each die group 158 is connected to a separate channel 146 using a total number of L channels. Flash memory electronics (FME) circuitry 160 of the flash memory module 142 controls each of the channels 146 to transfer data to and from the respective die groups 158. In one non-limiting example, K is set to 256 dies, L is set to 8 channels, and each physical die group has 32 dies. Other arrangements can be used (e.g., 256/16/16; 512/16/32, etc.). In this way, any of the dies 144 physically connected to a given channel 146 can be accessed at a given time using the associated channel. Generally, only one die per channel can be accessed at a time, although multiple planes 156 (FIG. 3) can be concurrently accessed.

In some embodiments, the various dies are arranged into one or more NVMe sets. An NVMe set, also referred to a die set, represents a portion of the storage capacity of the SSD that is allocated for use by a particular host (user/owner). NVMe sets are established with a granularity at the die level, so that each NVMe set will encompass a selected number of the available dies 144.

A first example NVMe set is denoted at 162 in FIG. 4. This first set 162 uses a single die 144 from each of the different channels 146. This arrangement provides fast performance during the servicing of data transfer commands for the set since all channels 146 are used to transfer the associated data to service a host access command. A limitation with this approach is that if the set 162 is being serviced, no other NVM sets can be serviced during that time interval. While the set 162 is depicted to only use a single die from each channel, the set could also be configured to use multiple dies from each channel.

A second example NVMe set is denoted at 164 in FIG. 4. This set uses dies 144 from less than all of the available channels 146. This arrangement provides relatively slower overall performance during data transfers as compared to the set 162, since for a given size of data transfer, the data will be transferred using fewer channels. However, this arrangement advantageously allows the SSD to service multiple NVMe sets at the same time, provided the sets do not share a common channel 146.

Figure 5:
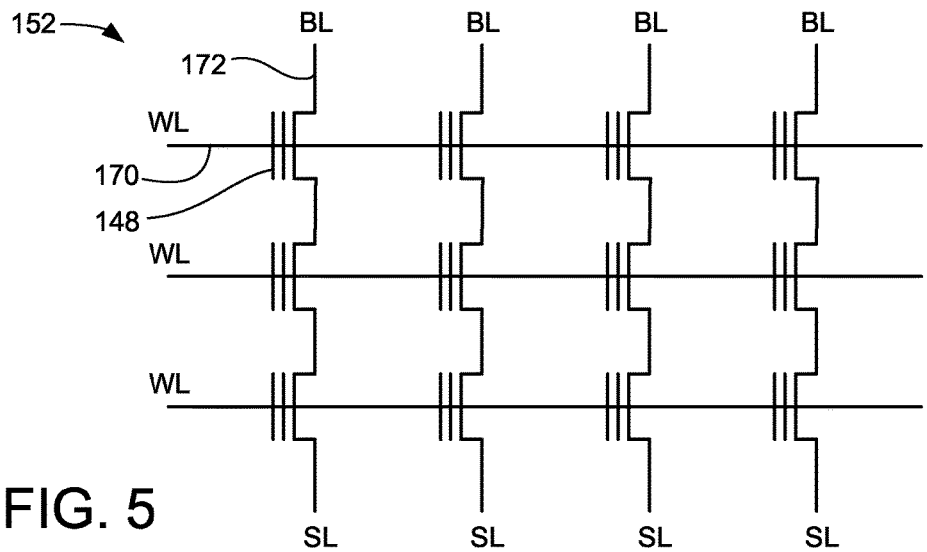
FIG. 5 provides a schematic depiction of a portion of the flash memory of FIG. 2 as operated by some embodiments.

FIG. 5 is a simplified schematic depiction of a portion of a selected erasure block 152 from FIG. 3. The flash memory cells 148 each generally take a MOSFET (metal oxide semiconductor field effect transistor) configuration with respective control gate, source and drain regions. A floating gate is isolated between the control gate and the channel between the source and drain.

The cells 148 are arranged in a matrix connected by word lines (WL) 170, bit lines (BL) 172 and source lines (SL) 174. During normal program (write) and read operations, current is passed from the BL to the SL through each stack in turn. This may take place by connecting the BL to a suitable rail voltage, such as 3.3V, and connecting the SL to a suitable reference level, such as electrical ground. The WLs 170 are connected to the control gates of the memory cells 148.

Variable gate control voltages (read voltages $V_{REF}$) are supplied to the memory cells via the WLs to read the programmed states of the cells. These voltages are applied through the use of read voltage set points that are register values that are loaded by the controller, and converted to voltages that are applied by the internal NAND read circuitry as discussed below. Pages of data are stored along the memory cells attached to a common word line (WL). Programming (write), read and erase operations may be carried out by supplying different combinations of voltages to the respective control lines to respectively apply, sense or remove accumulated charge to or from the floating gates.

Figure 6:
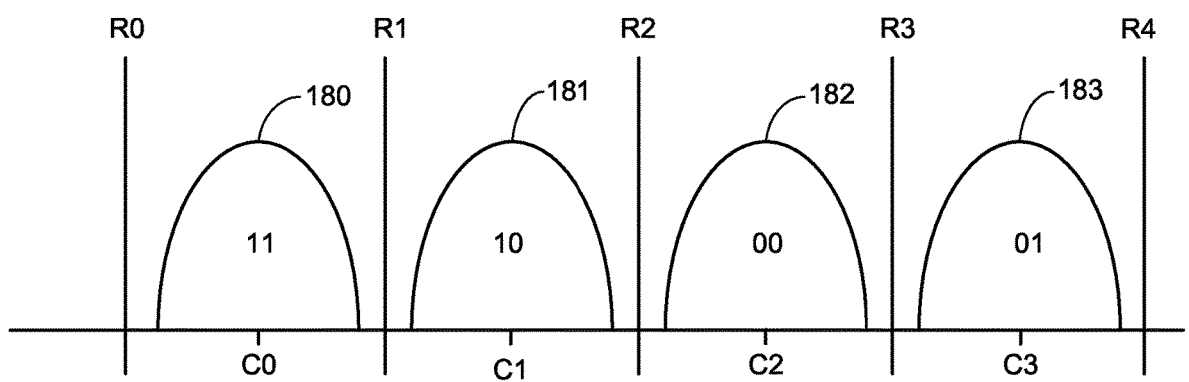
FIG. 6 shows charge distributions and associated read voltage set points for the flash memory of FIG. 2 arranged as MLCs (multi-level cells) each cell storing two bits of data.

FIG. 6 shows different populations of charge distributions that may be applied to the various memory cells 148 in FIG. 5. For ease of discussion, FIG. 6 depicts MLC (multi-level cell) programming so that each memory cell can have up to four charge states to depict two (2) bits of programming.

The four charge distributions C0-C3 are denoted at 180, 182, 184 and 186 and represent respective two-bit combinations of 11, 10, 00 and 01. Other encoding schemes can be used. In this case, each memory cell stores two bits of information using four charge states. In some cases, two pages worth of data can be stored across each associated set of memory cells connected to a common word line (see FIG. 5), with the various bit values of the associated pages indicated by the different bit placements of the respective cells (e.g., the most significant bits, MSBs, of each cell can correspond to the first page of data and the least significant bits, LSBs, of each cell can correspond to the second page of data).

Of interest are respective read voltage set points (levels) R0-R4 depicted in FIG. 6. The various read voltage set points indicate register control values that are applied to generate corresponding control gate (read) voltages necessary to place the different populations of memory cells into a forward (source-to-drain) conductive state. The read voltage set point R2 is sufficient to place all of the memory cells in populations 180 and 182 in a conductive state, but not those cells in populations 184 and 186. The read voltage set point R4 is sufficiently high to place all of the cells in a forward conductive state, while the read voltage set point R0 is insufficient to place any of the cells in a forward conductive state. By applying different sequences of the read voltage set points R0-R4 during a read operation and sensing whether the associated cells become conductive, the individual charge state of the cells can be determined. It will be recognized that, in practice, only the set points R1-R3 may be used during an MLC read.

Figure 7:
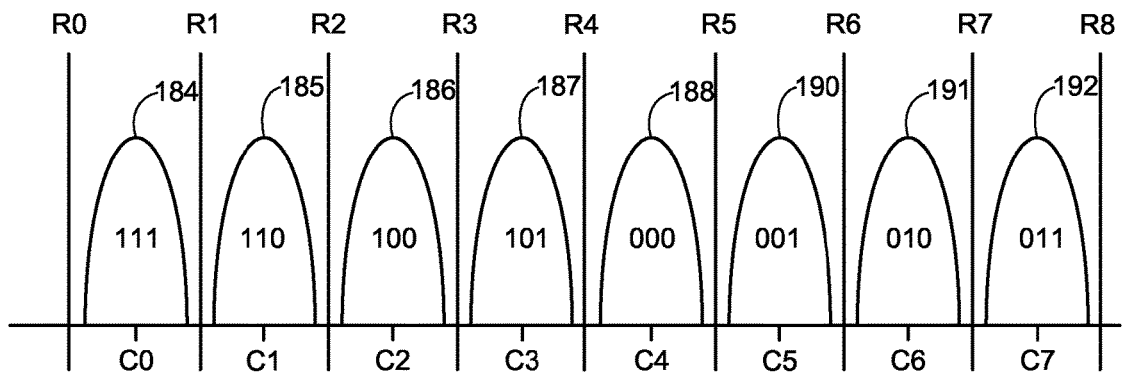
FIG. 7 shows charge distributions and associated read voltage set points for the flash memory of FIG. 2 arranged as TLCs (three-level cells) each cell storing three bits of data.

FIG. 7 shows different populations of charge distributions that may be applied to the various memory cells 148 in FIG. 5, arranged as TLCs (three-level cells). The charge distributions are denoted as 184-192 and correspond to charge levels C0-C7. In this case, each memory cell stores three bits of information using eight charge states. In some cases, three pages worth of data can be stored across each associated set of memory cells, with the various bit values of the associated pages indicated by the different bit placements of the respective cells (e.g., the MSBs correspond to a first page of data, the intermediate significant bits, or ISBs correspond to a second page of data, and the LSBs correspond to a third page of data). As noted above, any number of n data bits can be stored by each of the memory cells using 2n storage states.

Figure 8:
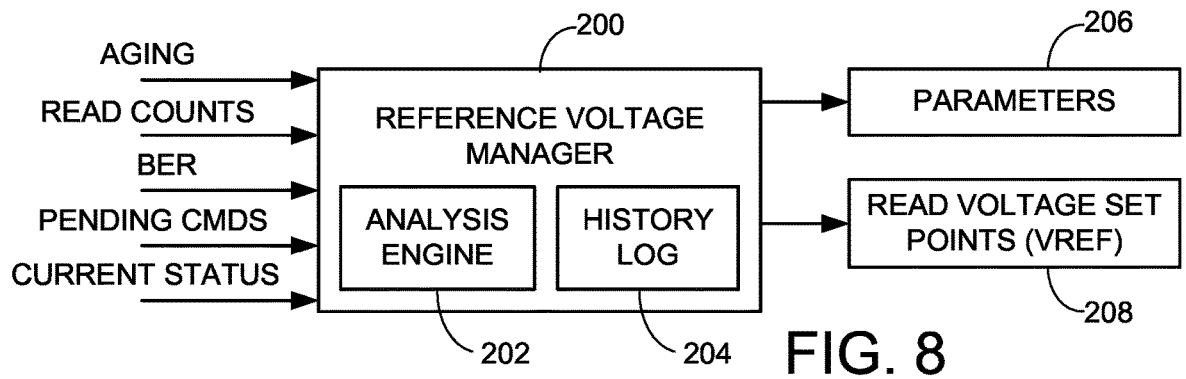
FIG. 8 shows a reference voltage manger constructed and operated in accordance with various embodiments to manage read voltage set points such as depicted in FIGS. 6-7.

FIG. 8 shows a reference voltage manager 200 of the SSD 110 in some embodiments. This circuit generally corresponds to the circuit 128 shown in FIG. 2. As explained below, the reference voltage manager 200 operates to select optimum read voltages ($V_{REF}$) during read operations carried out upon the flash memory 140. This is carried out by utilizing prior successful data read voltages as a starting point for a customized voltage calibration operation. The successful read voltages can be used to populate a histogram or other algorithm-based calculation to select an optimal $V_{REF}$ set (e.g., R0-R4 in FIG. 6; R0-R7 in FIG. 7, etc.). By avoiding a large sweep of test voltages, histogram generation and voltage selection based on read failures, the efficiency and accuracy of the calibration process can be enhanced.

Various embodiments contemplate different alternatives during the operation of the manager 200, including changing the $V_{REF}$ set size; logging read voltage history to recognize weak/drifting blocks; adapting $V_{REF}$ testing for localized BER (bit error rates), including adjustments to set size and selection criteria; using local minimums for $V_{REF}$ optimization prior to failure; using an internal trigger for $V_{REF}$ calibration instead of an external trigger; identifying drift or weak cells prior to failure, etc. In general, prior successful read voltages can utilize the existing recovery flow process to accumulate and select best fit values for future reads.

As shown in FIG. 8, the reference voltage manager 200 can utilize a number of inputs supplied by the system, including aging data (both P/E counts and data aging values), read counts, BER values, pending commands, current status data (e.g., temperature, etc.), and so on. In response, the reference voltage manager 200 can utilize an analysis engine 202 upon accumulated history data 204 (as a data structure in a local memory) to output various parameters (block 206) and read voltage set points (block 208) for use. It is contemplated that the calibration testing performed by the manager 200 can be carried out on a GCU level, a die level, an erasure block level, etc.

Figure 9:
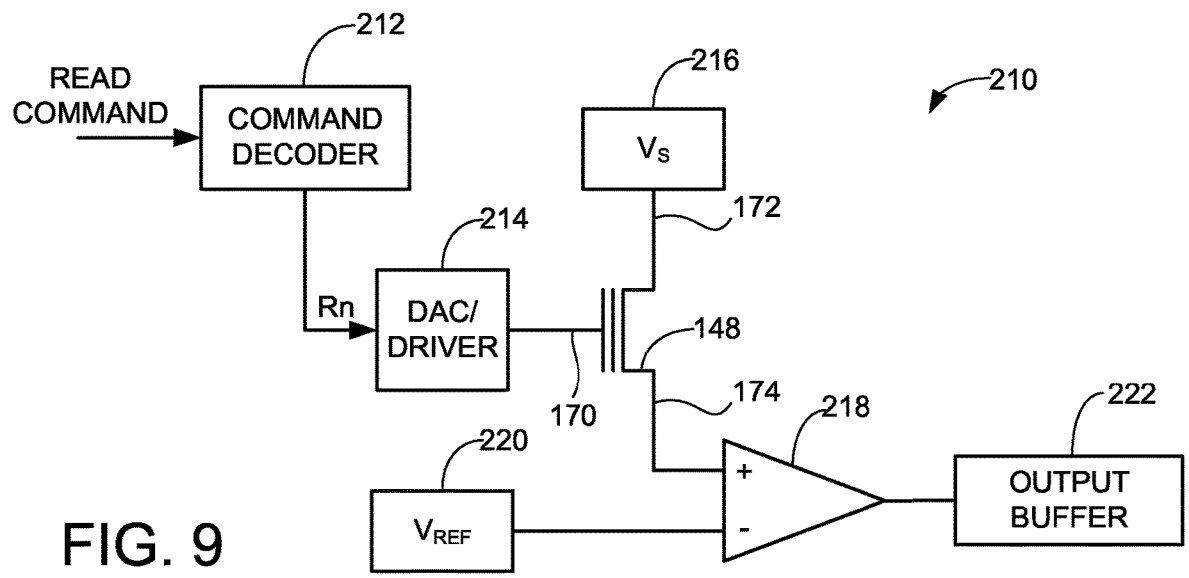
FIG. 9 is a functional block representation of a read/program verify circuit used to verify a programmed charge state of a selected flash memory cell in some embodiments.
Figure 10:
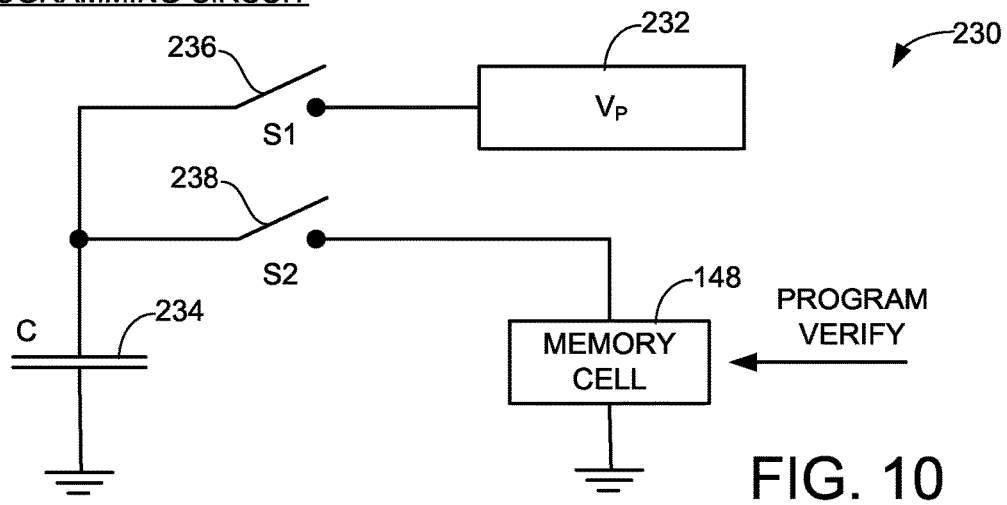
FIG. 10 is a functional block representation of a programming circuit used to program a programmed charge state of a selected flash memory cell in some embodiments.

In order to better understand the operation of the manager circuit 200, FIGS. 9 and 10 have been supplied to provide a brief overview of read and write (programming) circuitry of the SSD 110. FIG. 9 shows a read/program verify (PV) circuit 210 adapted to apply read voltage set points during read operations to detect the program states of the respective memory cells 148 in the array 140. The circuit 210 can operate both during read operations in which previously stored data are retrieved from the flash memory, as well as during programming operations to verify an appropriate programmed state has been achieved. Other configurations can be used so it will be understood that FIG. 9 (and FIG. 10) are merely illustrative and not limiting. The circuitry may be incorporated directly into the respective dies, although this is not necessarily required.

A command decoder 212 decodes an input read command and applies an appropriate read voltage set point value Rn to a digital-to-analog (DAC) driver circuit 214. The read voltage set point value Rn is a multi-bit digital representation of a corresponding selected analog control gate voltage value having a magnitude nominally selected to place the memory cell 148 in a forward conductive state based on the programmed state of the cell. The DAC/driver 214 applies an output to the control gate of the selected cell 148 via the associated word line (WL) 170 (see FIG. 5). The read voltage set points (Rn), also previously referred to as read levels or $V_{REF}$ values, are stored and applied as integers corresponding to DAC input values over the available DAC range.

A voltage source 216 applies a suitable source voltage Vs to the bit line (BL) 172 coupled to the memory cell 148 being read. A sense amplifier 218 coupled to the source line (SL) 174 determines whether the applied voltage is sufficient to place the cell into a conductive state through a comparison with a reference voltage $V_{REF}$ from a reference voltage source 220. A resulting bit value is output to an output buffer 222 (e.g., a 0 or 1) responsive to the comparison.

FIG. 10 is a functional block representation of a data programming circuit 230 of the SSD 110. The circuit 230 is configured to transfer charge to the floating gates of the various memory cells 148 during programming operations.

The circuit 230 takes a general charge pump configuration with a programming voltage source 232 that supplies a suitable programming voltage Vp, a capacitor (C) 234 or other charge storage device, and a pair of switches 236, 238 denoted as switches S1 and S2. The switches can take any suitable form such as power MOSFETs.

The circuit 230 operates to transfer discrete quanta of charge to the floating gate. To this end, one or more charge-transfer cycles are applied to the memory cell. During a charge cycle, switch S1 is closed, switch S2 is opened, and charge accumulates as the voltage VP is applied to the capacitor C. During a transfer cycle, switch S1 is opened and switch S2 is closed, enabling a transfer of the charge accumulated by the capacitor C to the memory cell 148.

The foregoing sequence is repeated as required until the total amount of accumulated charge on the floating gate of the memory cell 148 reaches a desired level indicative of the programming of the cell to the desired programmed state. A program verify operation is periodically carried out to assess the then-existing program state of the cell, using the read circuit 210 of FIG. 9. A suitable program verify threshold is used, which may be different from the various read voltage set points depicted in FIG. 6.

Program verify and read operations are carried out in a similar fashion. One difference is that a read operation for a memory cell storing more than a single bit may require multiple different voltage thresholds to discern the program state, whereas a program verify operation may involve the application of only a single voltage to ensure sufficient charge has been accumulated on the floating gate.

Figure 11:
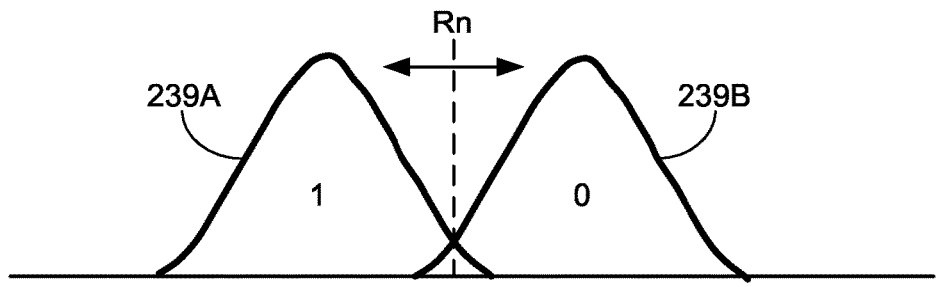
FIG. 11 graphically depicts a calibration operation carried out by the reference voltage manager of FIG. 8 in accordance with some embodiments.

FIG. 11 provides a simple graphical depiction of two adjacent populations of charge states in the flash memory 140. A first population 239A is denoted as corresponding to a first charge state (in this case, programming level "logical 1") and a second population 239B is denoted as corresponding to a second charge state (programming level "logical 0). A calibration operation carried out by the manager 200 may start with an initially selected level Rn and then perform sweeps as shown to select a final value; that is, in addition to the initial value Rn, positive and negative increments/decrements may be applied to find the final value. Suitable criteria can be used such as lowest BER, lowest syndrome count from the LDPC decoders, etc.

Figure 12A:
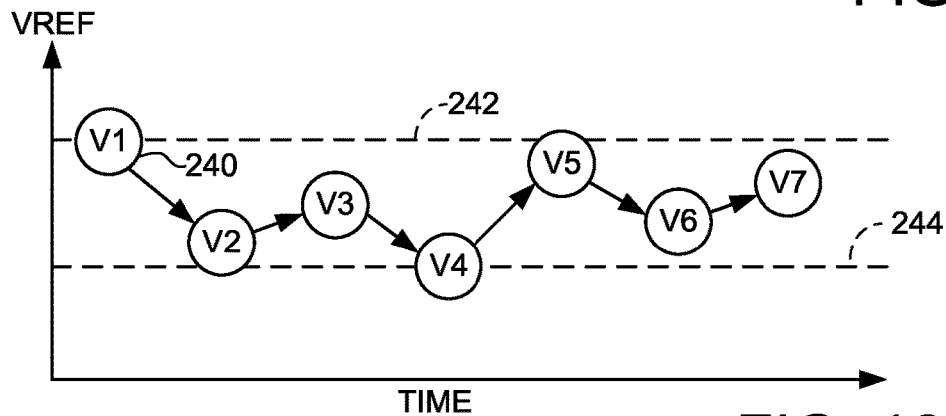
FIGS. 12A and 12B show different read voltage set points for a group of flash memory cells over an elapsed period of time.

FIG. 12A shows a progression of optimal $V_{REF}$ read voltages for a set of memory cells over an elapsed period of time. The read voltages are denoted numerically at 240 and are identified as V1-V7. It is contemplated that each of the read voltages was obtained as an optimal value during a separate calibration operation. While the most previously applied read voltage may be used as the starting point, it is contemplated that the manager 200 uses a mathematically derived starting point based on the previous historically successful levels.

FIG. 12A shows that the voltages V1-V7 are somewhat random and are bounded by an upper limit 242 and a lower limit 244. In this way, the voltages are relatively well-behaved and are maintained within a relatively narrow band.

Figure 12B:
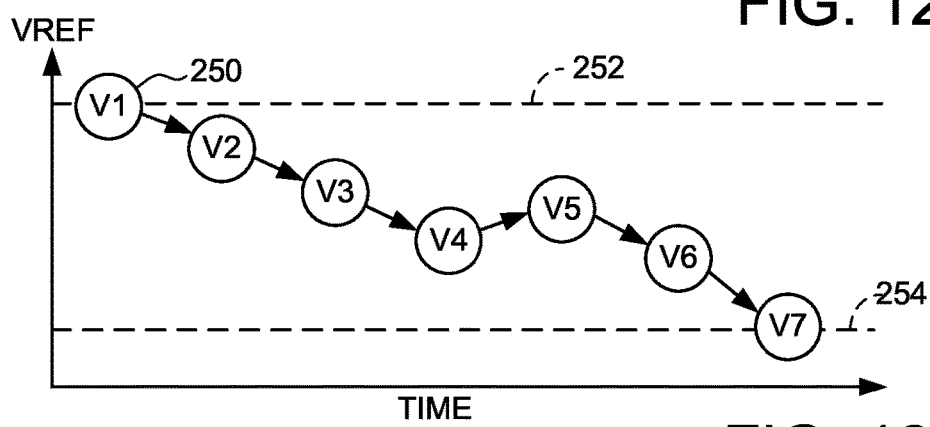

FIG. 12B shows another set of read voltages 250 (identified as V1-V7) for a different set of memory cells over an elapsed period of time. In this case, the memory cells indicate drift, in that there is a substantially downward shift of each successfully selected read voltage over the elapsed period of time between upper and lower limits 252, 254. As before, the manager 200 uses a mathematically derived starting point to initiate a calibration process such as depicted in FIG. 11. While FIGS. 12A and 12B each shown only seven (7) values, it will be appreciated that many tens, hundreds or thousands of data points (or more) may be accumulated and used in the analysis.

Figures 13A, 13B, 13C:
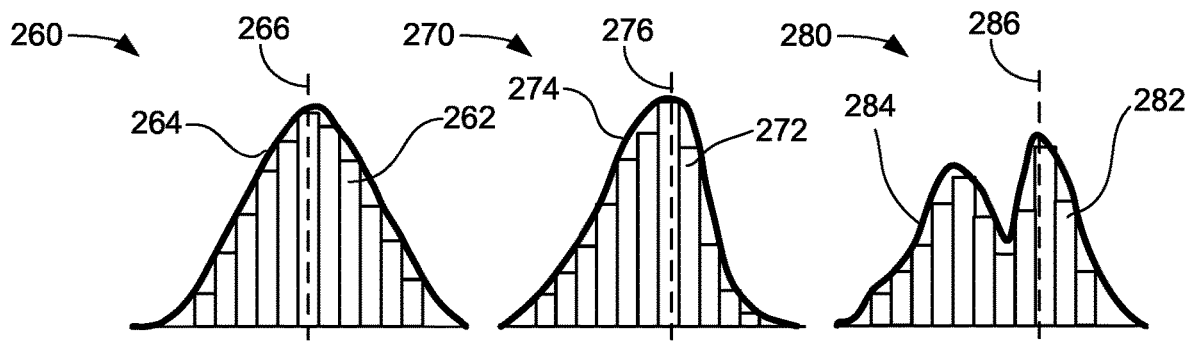
FIGS. 13A, 13B and 13C are graphical depictions of distributions of the read voltage set points over an elapsed period of time obtained using respective curve-fit operations.

FIGS. 13A-13C depict different types of distributions of previously determined successful read voltages for different sets of memory cells. FIG. 13A provides a distribution 260 that is substantially Gaussian in shape. In this case, individual accumulated samples are indicated at 262, and a curve fit approximation is provided at 264. A suitable mid-point is shown by dotted line 266. In this case, the line 266 may be a suitable starting point for the accumulated successful read voltages during a next calibration operation (e.g., FIG. 13). As such, the observed behavior of the distribution 260 of FIG. 13A may be similar to the random, tightly arrayed values from FIG. 12A, so that it may be advantageous under these circumstances to make a time-independent determination of an optimal read voltage to commence the calibration operation. That is, no weighting is applied to the respective samples, so that most recently received samples are weighed the same as samples that were previously obtained earlier in the associated time window over which the samples have been accumulated.

This is not necessarily required, however; in an alternative embodiment a time weighting factor can be applied so that more recently received samples receive greater weight than older samples. In this case, the initial read voltage to commence the calibration operation may be shifted to the left or right of the line 266 in FIG. 13A.

FIG. 13B shows another distribution 270 for a similar number of successful read voltages for a different set of memory cells. In this case, the samples are accumulated as shown at 272, and curve-fit to provide distribution curve 274. The distribution curve 274 is skewed (offset), so that the behavior of the memory cells may be similar to a trending pattern as discussed above in FIG. 12B. As before, a suitable starting point is denoted at 276, which can be selected either as the midpoint of the distribution (without regard of time-ordering) or can be selected using time weighting as discussed above (e.g., more recent samples are given higher weighting, older samples given lower weighting).

FIG. 13C shows yet another distribution 280 for yet another set of memory cells. As before, samples are indicated by bars 282 and curve fit using curve 284. In this case, the memory cells exhibit a bi-modal distribution. This shows relatively large swings (both positive and negative) over time. A suitable starting point can be derived as indicated by dotted line 286, which can be selected using time-independent or time-weighted mechanisms.

It will be observed that the accumulation of a statistically significant number of previously successful read voltage levels as depicted in FIGS. 13A-13C enable the manager 200 to select an appropriate read voltage to commence the read calibration operation on the associated set of cells. The accumulated data further provides useful information with regard to the state and performance of the associated cells. Ideally, it would be generally expected that well-performing memory cells might tend to have a better performance profile such as that shown in FIG. 13A. Contrawise, information regarding the health and reliability of the cells can be gleaned by detecting skewed, multi-modal, or other distributions over time. Accumulating and maintaining the history data in a history log thus provides both a better starting level to commence the calibration operation, as well as to provide important insight into the health and performance of the cells. In some cases, decisions can be made based on the successful read voltages, such as a need to relocate data, perform garbage collection operations, to deallocate memory locations from further use to avoid a pending catastrophic failure, etc.

As noted above, periodically certain operations may be reset based on internal operations. For example, performing a garbage collection operation will tend to reduce or remove historic charge drift effects. Thus, in some cases performing a garbage collection operation may result in the resetting of the accumulated successful read voltages, thereby commencing a new distribution. However, it may be useful instead to maintain the accumulated data across multiple PE cycles, in order to ascertain long term performance effects. Multiple distributions can be maintained, one for each garbage collection interval, and compared over time to detect long term trends and performance characteristics.

Figure 14:
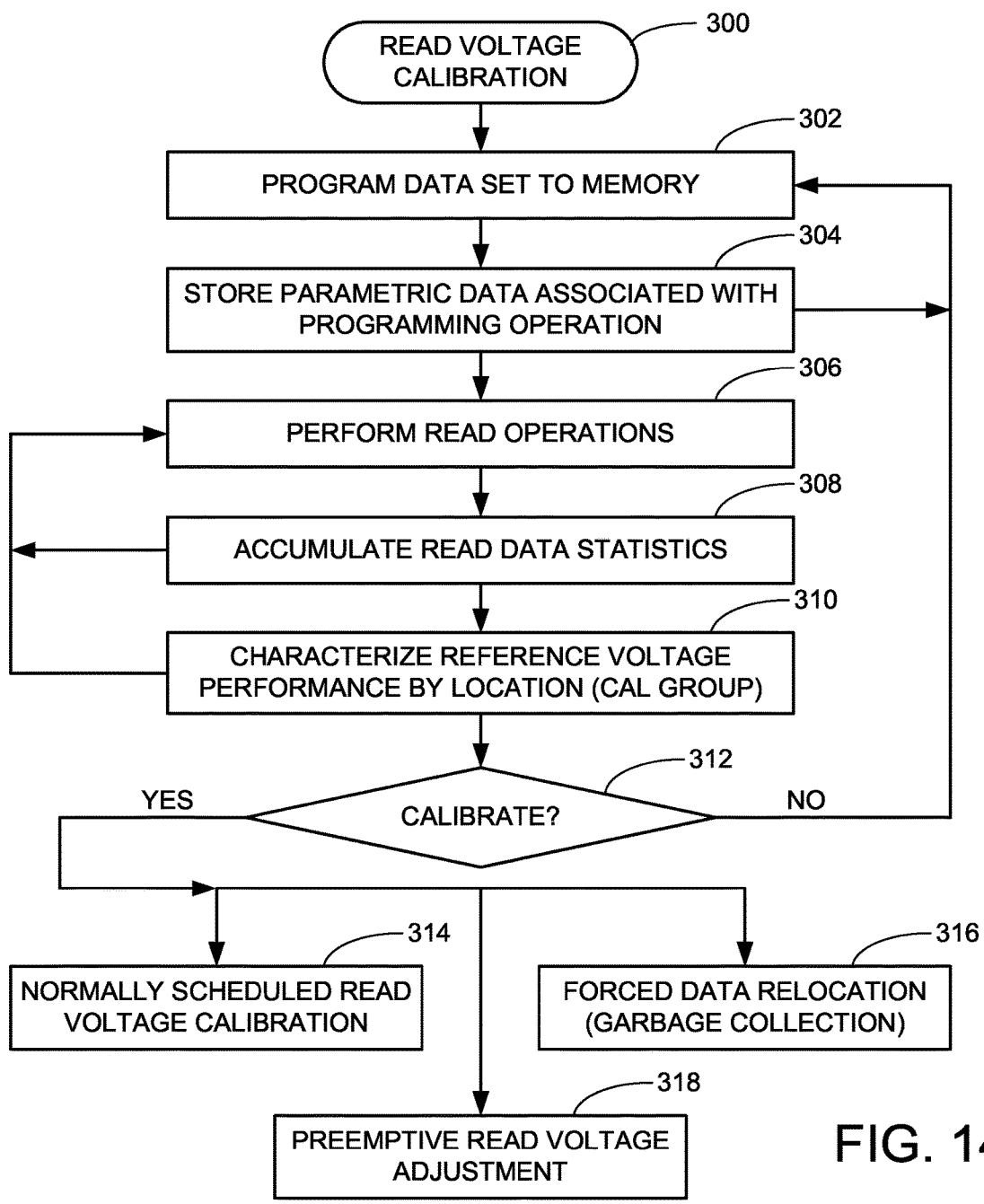
FIG. 14 is a flow chart for a read voltage calibration routine carried out in accordance with some embodiments.

FIG. 14 is a flow chart for a read voltage calibration routine 300 generally representative of steps that may be carried out by various embodiments. It will be appreciated that the routine is merely illustrative and any number of alterations can be implemented depending on the requirements of a given application in view of the present disclosure.

Various data sets are programmed to the memory as required at step 302, and parametric data values associated with the programming of the data are collected and stored at step 304. One such parametric data value may be a temperature at the time of programming ("Tprogram"). Another parametric data value may be a date/time code stamp. This sequencing of steps 302 and 304 continues as new data sets are programmed to new locations in the memory. The data sets can take any suitable form, including RAID stripes, code words, etc. The data sets may be successively written to one or more allocated and available GCUs.

At step 306, periodic read operations are carried out to retrieve the previously stored data. Read data statistics associated with the read operations are accumulated at step 308. These statistics can include current temperature measurements ("Tcurrent"), accumulated read counts, BER values, read recovery statistics, and so on. At this point it will be noted that steps 302 through 308 represent normal operation of the SSD 110 to write data to, and read data from, the flash memory 140. The data transfers can include the writing of user data responsive to host commands from the host 106 (FIG. 1), the writing, reading and updating of map data to track the locations of the user data, the writing of other forms of metadata, the relocation of data, garbage collection operations, etc.

While the storage device 110 continues to operate as set forth above, the reference voltage manager 200 operates at step 310 to characterize reference voltage performance by location. This can include accumulating successful read voltages, forming distributions, observing locations that have sub-optimal performance (e.g., higher BER/syndrome/iteration levels, etc.), and so on.

Of particular note is the operation of the manager 200 at step 310 to select an optimal set of read voltages based on the accumulated history, statistics and analysis of the ongoing operation. In this way, the optimal successful read voltages can be limited to the read voltages obtained during the calibration operations, or can also be based on successful reads during steps 306, 308. This latter approach provides a larger population of successful read voltages upon which most recently selected, adaptively adjusted read voltages can be implemented.

As desired, the latest selected initial read voltages can be immediately used during the ongoing read operations at step 306, as shown by return arrow from step 310. In addition, the background operation of step 310 can further enable the manager 200 to initiate calibration operations at suitable times, as indicated at decision step 312.

In some cases, read voltage calibration operations can be scheduled for the various locations within the memory on a periodic, repeating basis. The locations can be arranged as calibration groups, so that each group utilizes the same calibration settings (e.g., read voltage values) based on testing. Calibration groups can be arranged on an erasure block basis, a GCU basis, an address basis (e.g., a certain location across many different dies, including dies in different GCUs), and so on. In this way, it is not necessary to perform a calibration operation upon every memory cell in the array, provided statistically representative cells can be evaluated along with a determination that the remaining cells in a given calibration group will behave similarly. Part of the operation of the storage manager 200 can thus be to adaptively adjust the various calibration groups based on historical performance trends.

Depending on the detected trends from step 310, the storage manager 200 may operate as shown at step 314 to perform a normally scheduled read voltage calibration for each of a selected number of the calibration groups as desired. This can be performed as discussed above in FIG. 11, as a background operation in which read voltages are sent for evaluation (per FIG. 9) commencing with an initial, optimal read voltage selected by the analysis engine 202 of the storage manager 200 based on the accumulated history data 204 for that location/group.

The calibration policy of the SSD may be established such that calibration operations must normally be performed upon each group within some maximum amount of elapsed period of time (e.g., within every X seconds/minutes/hours, etc.). Alternatively, the observed behavior may be such that some calibration groups require an accelerated calibration interval (e.g., within an interval of Y where Y is less than X) such as indicated by distributions in FIGS. 13B-13C. Other calibration groups can have a relaxed calibration interval Z (where Z is greater than X), such as indicated by the distribution in FIG. 13A.

In further embodiments, the trend behavior of a given location may lead the storage manager 200 to instead perform a forced calibration operation, which may include a garbage collection operation or other data relocation actions, as shown by step 316. As noted above, the storage manager 200 may further initiate a preemptive read voltage adjustment for certain locations, as indicated by step 318.

It will be recalled that, depending on the manner in which the data are stored to a set of memory cells (e.g., SLCs, MLCs, TLCs, QLCs, etc.), the read voltage sets may incorporate multiple read voltages (e.g., 4+ read voltages for MLCs, 8+ read voltages for TLCs, etc.). Accordingly, the various statistics evaluated herein may be separately maintained for each of the read voltage Rn values for each location.

Figure 15:
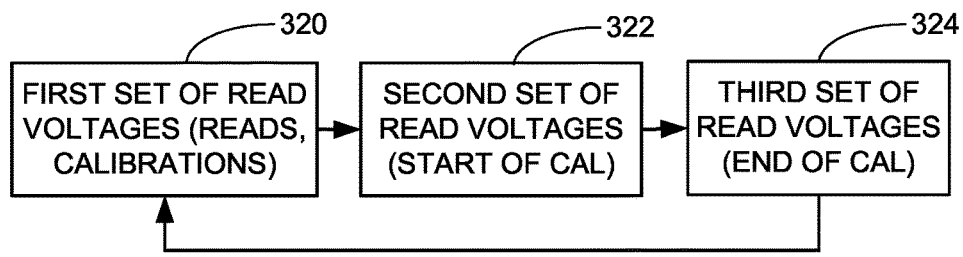
FIG. 15 is a sequence diagram to represent respective sets of read voltages derived and used during the operation of the routine of FIG. 14 in some embodiments.

Finally, FIG. 15 shows an arrangement of the various sets of read voltages that can be generated and used by the system during the flow of FIG. 14. Block 320 represents a first set of read voltages. These may be the various read voltages utilized during the read operations of block 306 to retrieve user data and metadata from the flash memory. Additionally or alternatively, these can be the various read voltages obtained during the various calibration operations upon the respective calibration groups. In some cases, read voltages that do not provide successful readback of the data may be jettisoned (e.g., if an extensive read retry is carried out, only the read voltages that ultimately resulted in successful recovery of the data may be incorporated). It will be appreciated that the various sets of read voltages in block 320 make up the respective histograms or other data accumulations by the storage manager 200.

Block 322 represents a second set of read voltages. These correspond to the initial read voltages selected by the storage manager based on the curve-fit operation (or other analysis) of the accumulated read voltages in block 320. It will be appreciated that the second set of read voltages are the starting point for a calibration operation (see e.g., FIG. 11) and, as desired, may be inserted into the ongoing read operations (e.g., step 318).

Block 324 represents a third set of read voltages. These are the read voltages that emerge from a calibration operation, and may represent an incremental adjustment to the second set of read voltages. As before, the third read voltages are thereafter utilized during subsequent read operations (step 306), and are incorporated into the first set of read voltages pending the next evaluation cycle.

The skilled artisan will recognize that there will tend to be a tradeoff between the amount of background processing required to carry out the parametric adjustments and the associated improvements in BER read performance; better read transfer rates will occur with greater frequency and complexity of the preemptive parametric adjustment operations, but at the cost of additional background processing and greater write amplification. Hence, individual owners of the various NVMe namespaces may specify different routines, thresholds, etc. that may be carried out to optimize the data transfers for the data stored in that namespace as noted above.

While various embodiments have been directed to the use of an SSD with a flash memory, the various embodiments can be readily adapted to any number of other types of NVM memory, including but not limited other forms of erasable and rewritable semiconductor memory.

It is to be understood that even though numerous characteristics and advantages of various embodiments of the present disclosure have been set forth in the foregoing description, together with details of the structure and function of various embodiments of the disclosure, this detailed description is illustrative only, and changes may be made in detail, especially in matters of structure and arrangements of parts within the principles of the present disclosure to the full extent indicated by the broad general meaning of the terms in which the appended claims are expressed.

What is claimed is:

1. A method comprising:
   storing data to a group of memory cells in a non-volatile memory (NVM);
   reading the data from the group of memory cells by applying a first set of read voltages thereto;
   accumulating the first set of read voltages into a history distribution;
   calibrating the group of memory cells by selecting a second set of read voltages based on the history distribution, adjusting the second set of read voltages to arrive at a third set of read voltages, and using the third set of read voltages to subsequently read the data from the group of memory cells;
   incorporating the third set of read voltages into the history distribution to form an updated history distribution that includes at least the first and third sets of read voltages; and
   using the updated history distribution to schedule a subsequent data transfer operation upon the group of memory cells.

2. The method of claim 1, wherein the first set of read voltages is characterized as multiple sets of read voltages having different voltage levels applied during each of a succession of read operations in which the data are read from the group of memory cells.

3. The method of claim 1, wherein the accumulating step comprises arranging the first set of read voltages into a histogram, performing a curve fit operation upon the histogram, and selecting the second set of read voltages as a midpoint of the curve fit operation.

4. The method of claim 3, wherein time-based weighting is applied to sample values within the respective first set of read voltages so that more recently utilized ones of the sample values receive a higher weighting and less recently utilized ones of the sample values receive a lower weighting.

5. The method of claim 3, wherein the subsequent data transfer operation of the using step comprises a subsequent calibrating of the group of memory cells which is carried out at a time selected responsive to a shape of the curve fit operation.

6. The method of claim 1, wherein each of the first and third sets of read voltages are identified during respective calibration operations upon the group of memory cells carried out at different times, each of the respective calibration operations comprising incrementally adjusting of read voltages to provide a resulting error rate that meets predetermined criteria.

7. The method of claim 1, wherein the history distribution comprises sets of calibrated read voltages obtained during each of a succession of calibration operations upon the group of memory cells carried out over an operational interval, wherein at least one garbage collection operation involving an erasure of the group of memory cells has occurred during the operational interval.

8. The method of claim 1, wherein the NVM is characterized as a NAND flash memory of a solid-state drive (SSD).

9. The method of claim 1, wherein the subsequent data transfer operation of the using step comprises a garbage collection operation upon the group of memory cells.

10. The method of claim 1, wherein the group of memory cells are arranged into a garbage collection unit (GCU), and the third set of read voltages are subsequently applied to read operations upon the GCU after a conclusion of the calibration step.

11. An apparatus comprising:
   a non-volatile memory (NVM) comprising semiconductor memory cells;
   a read circuit configured to read a programmed state of the memory cells responsive to application of a first of read voltages thereto; and
   a read voltage manager circuit configured to perform a first calibration operation to generate the first set of read voltages, accumulate the first set of read voltages into a history distribution comprising additional sets of read voltages obtained by the read voltage manager circuit from a time-ordered sequence of previously performed calibration operations, select a second set of read voltages based on the history distribution, and perform a second calibration operation upon the memory cells by incrementally adjusting the second set of read voltages to arrive at a third set of read voltages that provide an error rate that meets predetermined criteria, the read circuit thereafter using the third set of read voltages during a subsequent read operation after a conclusion of the calibration operation, the read voltage manager circuit appending the third set of read voltages to the history distribution for use during subsequent calibration operations.

12. The apparatus of claim 11, wherein the read voltage manager circuit determines a health status of a group of the memory cells responsive to a shape of the history distribution.

13. The apparatus of claim 12, wherein each of the first, second and third read voltages respectively comprise read voltages of R0 through Rn, wherein n is a plural number selected responsive to a total number of charge states stored by the memory cells of the NAND flash memory.

14. The apparatus of claim 12, wherein each memory cell in the NAND flash memory stores multiple bits of data.

15. The apparatus of claim 11, wherein the first set of read voltages is characterized as multiple sets of read voltages having different voltage levels applied during each of a succession of read operations in which the data are read from the group of memory cells.

16. The apparatus of claim 11, wherein the read voltage manager arranges the first set of read voltages into a histogram, performs a curve fit operation upon the histogram, and selects the second set of read voltages as a midpoint of the curve fit operation.

17. The apparatus of claim 16, wherein the read voltage manager further applies time-based weighting to sample values within the history distribution so that more recently utilized ones of the sample values receive a greater weighting and less recently utilized ones of the sample values receive a lower weighting.

18. The apparatus of claim 16, wherein a garbage collection operation is performed on a selected grouping of the memory cells responsive to a shape of the history distribution curve fit operation.

19. A data storage device, comprising:
a flash memory comprising flash memory cells arranged into garbage collection units (GCUs) each allocated and erased as a unit;
a controller circuit configured to transfer user data sets between the GCUs and an external client device; and
a read voltage manager circuit configured to accumulate read voltages applied by the controller circuit to successfully retrieve the user data sets into a population distribution, to select an initial calibration set of read voltages based on a shape of the population distribution, to perform a calibration operation upon a calibration group of the memory cells to derive a final calibration set of read voltages based on the initial calibration set of read voltages, to implement subsequent read operations using the final calibration set of read voltages, and to add the final calibration set of read voltages to the population distribution for use during a subsequent calibration operation, the population distribution comprising previously obtained calibration sets of read voltages generated from corresponding calibration operations upon the flash memory cells prior to generation of the final calibration set of read voltages.

20. The data storage device of claim 19, wherein the read voltage manager circuit further directs the controller circuit to perform a garbage collection operation upon a selected GCU responsive to a shape of a population distribution of read voltages used during read operations upon data stored within the selected GCU.

* * * * *